United States Patent
Liao et al.

(10) Patent No.: US 8,884,346 B2
(45) Date of Patent: Nov. 11, 2014

(54) SEMICONDUCTOR STRUCTURE

(71) Applicant: United Microelectronics Corp., Hsin-Chu (TW)

(72) Inventors: Chin-I Liao, Tainan (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/156,442

(22) Filed: Jan. 15, 2014

(65) Prior Publication Data

US 2014/0124835 A1      May 8, 2014

Related U.S. Application Data

(62) Division of application No. 13/440,978, filed on Apr. 5, 2012, now Pat. No. 8,664,069.

(51) Int. Cl.
| | | |
|---|---|---|
| *H01L 29/786* | (2006.01) | |
| *H01L 29/78* | (2006.01) | |
| *H01L 21/285* | (2006.01) | |
| *H01L 29/66* | (2006.01) | |
| *H01L 21/265* | (2006.01) | |

(52) U.S. Cl.
CPC ...... H01L 29/7848 (2013.01); H01L 21/28518 (2013.01); H01L 29/66628 (2013.01); H01L 21/28525 (2013.01); *H01L 21/26506* (2013.01); *H01L 29/66636* (2013.01)
USPC .............. 257/288; 257/E29.04; 257/E29.116; 257/E29.092; 438/301; 438/303; 438/305

(58) Field of Classification Search
CPC .................... H01L 29/7848; H01L 29/66628
USPC ............. 257/288, E29.04, E29.116, E29.117, 257/E21.092; 438/300, 301, 303, 305, 306
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |

(Continued)

Primary Examiner — Allan R Wilson
(74) Attorney, Agent, or Firm — Winston Hsu; Scott Margo

(57) ABSTRACT

A semiconductor structure includes a gate structure, an epitaxial layer and a carbon-containing silicon germanium cap layer. The gate structure is located on a substrate. The epitaxial layer is located in the substrate beside the gate structure. The carbon-containing silicon germanium cap layer is located on the epitaxial layer. Otherwise, semiconductor processes for forming said semiconductor structure are also provided.

11 Claims, 5 Drawing Sheets

(56) References Cited

U.S. PATENT DOCUMENTS

| | | |
|---|---|---|
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,064,399 B2 | 6/2006 | Babcock |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,612,389 B2 | 11/2009 | Lin |
| 7,667,227 B2 | 2/2010 | Shimamune |
| 7,691,752 B2 | 4/2010 | Ranade |
| 7,727,845 B2 * | 6/2010 | Wang et al. ............... 438/303 |
| 7,781,799 B2 | 8/2010 | Yu |
| 7,838,370 B2 | 11/2010 | Mehta |
| 8,093,634 B2 | 1/2012 | Mowry |
| 2002/0045317 A1 | 4/2002 | Oishi |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0093075 A1 | 5/2005 | Bentum |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115934 A1 | 6/2006 | Kim |
| 2006/0115949 A1 | 6/2006 | Zhang |
| 2006/0163558 A1 | 7/2006 | Lee |
| 2006/0166414 A1 | 7/2006 | Carlson |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0093033 A1 * | 4/2007 | Wang et al. ............... 438/303 |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039388 A1 | 2/2009 | Teo |
| 2009/0039389 A1 | 2/2009 | Tseng |
| 2009/0045456 A1 | 2/2009 | Chen |
| 2009/0081836 A1 | 3/2009 | Liu |
| 2009/0095992 A1 | 4/2009 | Sanuki |
| 2009/0108291 A1 | 4/2009 | Cheng |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2011/0117732 A1 | 5/2011 | Bauer |
| 2011/0171795 A1 | 7/2011 | Tsai |
| 2014/0113424 A1 * | 4/2014 | Lin et al. ............... 438/300 |

* cited by examiner

SEMICONDUCTOR STRUCTURE

CROSS REFERENCE TO RELATED APPLICATIONS

This application is a divisional application of and claims the benefit of U.S. patent application Ser. No. 13/440,978, filed Apr. 5, 2012.

BACKGROUND OF THE INVENTION

1. Field of the Invention

The present invention relates generally to a semiconductor structure and a process thereof, and more specifically to a semiconductor structure and a process thereof, that forms a carbon-containing silicon germanium cap layer on an epitaxial layer.

2. Description of the Prior Art

For decades, chip manufacturers have made metal-oxide-semiconductor (MOS) transistors faster by making them smaller. As the semiconductor processes advance to very deep sub micron era, such as 65-nm node or beyond, how to increase the driving current for MOS transistors has become a critical issue.

In order to improve device performances, crystal strain technology has been developed. Crystal strain technology is becoming more and more attractive as a mean to obtain better performances in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

In the prior arts, attempts have been made to use a strained silicon layer, which was grown epitaxially on a silicon substrate with a silicon germanium (SiGe) layer disposed in between. In this type of MOS transistor, a biaxial tensile strain occurs in the epitaxial silicon layer due to the silicon germanium having a larger lattice constant than the silicon one, and, as a result, the band structure alters, and the carrier mobility is increased. This enhances the speed performances of the MOS transistors.

However, ingredients of the epitaxial layer are complex and will diffuse easily and pollute the peripheries during subsequent processes.

SUMMARY OF THE INVENTION

The present invention provides a semiconductor structure and a process thereof that forms a carbon-containing silicon germanium cap layer on an epitaxial layer, to prevent germanium in the epitaxial layer or in the cap layer from precipitating to the surface of the cap layer.

The present invention provides a semiconductor structure including a gate structure, an epitaxial layer and a carbon-containing silicon germanium cap layer. The gate structure is located on a substrate. The epitaxial layer is located in the substrate beside the gate structure. The carbon-containing silicon germanium cap layer is located on the epitaxial layer.

The present invention provides a semiconductor process including the following steps. A gate structure is formed on a substrate. An epitaxial layer is formed in the substrate beside the gate structure. An in-situ epitaxial process is performed to form a carbon-containing silicon germanium cap layer on the epitaxial layer.

The present invention provides a semiconductor process including the following steps. A gate structure is formed on a substrate. An epitaxial layer is formed in the substrate beside the gate structure. A silicon germanium cap layer is formed on the epitaxial layer. Carbon is doped into the silicon germanium cap layer to form a carbon-containing silicon germanium cap layer on the epitaxial layer.

According to the above, the present invention provides a semiconductor structure and a process thereof that forms a carbon-containing silicon germanium cap layer on an epitaxial layer, to prevent germanium in the epitaxial layer or in the cap layer from precipitating to the surface of the cap layer. Therefore, black spots formed on the surface of the cap layer are avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
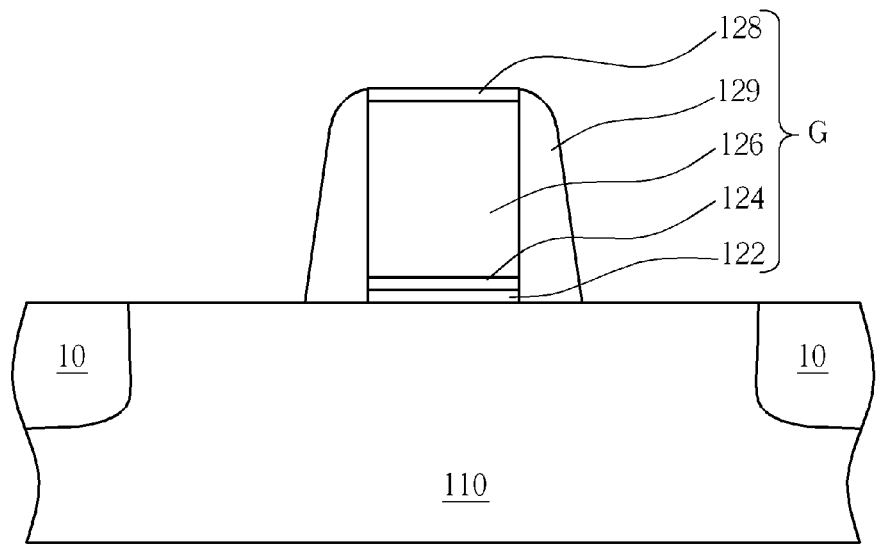
FIGS. 1-4 schematically depict cross-sectional views of a semiconductor process according to a first embodiment of the present invention.

FIGS. 1-4 schematically depict cross-sectional views of a semiconductor process according to a first embodiment of the present invention. A substrate 110 is provided. The substrate 110 may be a semiconductor substrate such as a silicon substrate, a silicon containing substrate, an III-V group-on-silicon (such as GaN-on-silicon) substrate, a graphene-on-silicon substrate or a silicon-on-insulator (SOI) substrate. An isolation structure 10 is formed between every transistor to electrically isolate these transistors. The isolation structure 10 may be a shallow trench isolation structure, but it is not limited thereto. A gate structure G is formed on the substrate 110. The gate structure G may include a stacked structure composed of a buffer layer 122, a dielectric layer 124, a gate layer 126, a cap layer 128 and a spacer 129 located on the substrate 110 beside the buffer layer 122, the dielectric layer 124, the gate layer 126 and the cap layer 128. More precisely, methods of forming the gate structure G may include: entirely covering a buffer layer (not shown), a dielectric layer (not shown), a gate layer (not shown) and a cap layer (not shown) on the substrate 110; patterning layers of them to form a buffer layer 122, a dielectric layer 124, a gate layer 126 and a cap layer 128; conformally covering a spacer (not shown) on the cap layer 128 and the substrate 110; then, forming the spacer 129 by an etch process.

The buffer layer 122 may include an oxide layer. The gate dielectric layer 124 may be a dielectric layer having a high dielectric constant, such as the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The gate layer 126 may include a polysilicon layer, or a sacrificial layer, which may be replaced by a metal layer to form a metal gate in subsequent processes. The cap layer 128 may be a nitride layer or etc. The spacer 129 may be a single layer or a multilayer structure composed of silicon nitride, silicon oxide or etc. The aforesaid materials of the buffer layer 122, the dielectric layer 124, the gate layer 126 and the cap layer 128 are just some cases, but the present invention is not restricted thereto.

Figure 2:
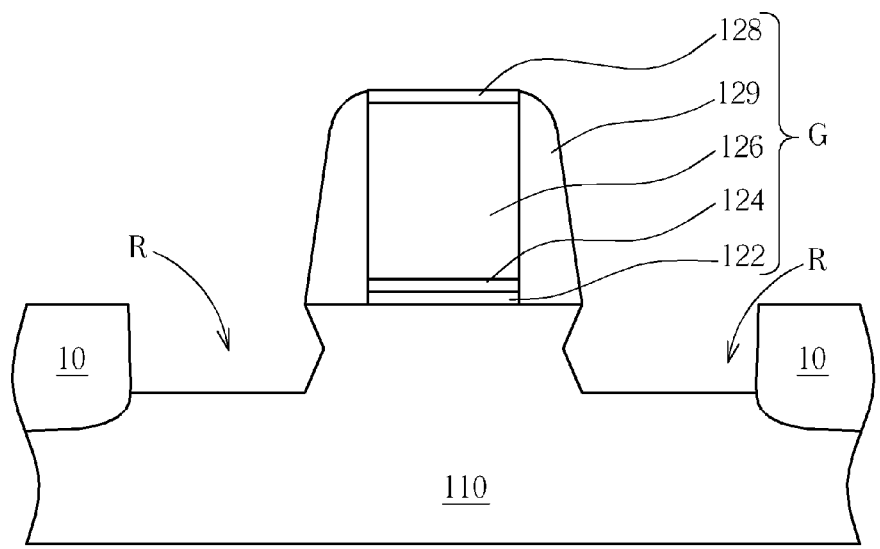
Figure 3:
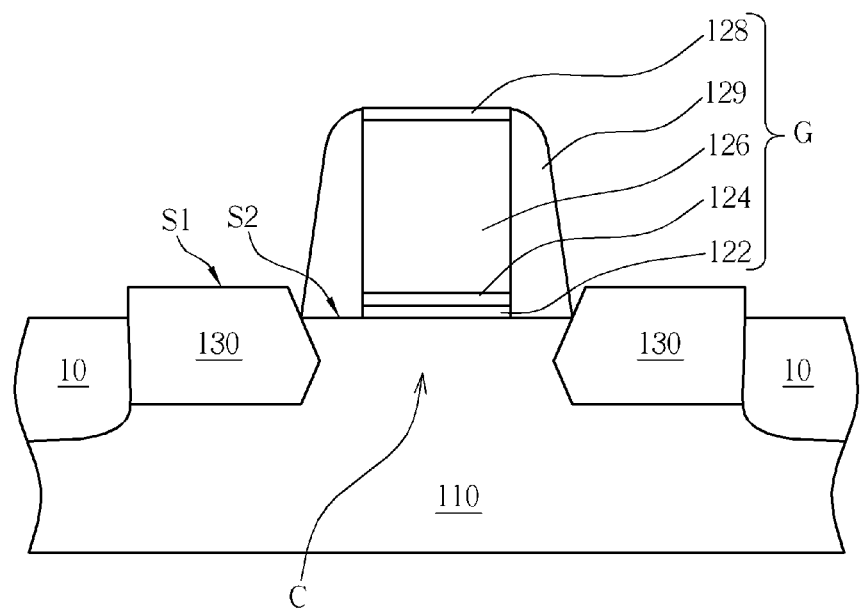

As shown in FIG. 2, two recesses R are formed in the substrate 110 beside the gate structure G by methods such as sequentially performing a dry etching process and a wet etching process. After cleaning steps, an epitaxial layer 130 is formed in the recesses R beside the gate structure G through a selectively epitaxial process as shown in FIG. 3. An ion implantation process or an in-situ doping process may be performed before the recesses R are formed, after an epitaxial layer 130 is formed, or as an epitaxial layer 130 is formed, to implant dopants into the epitaxial layer 130 for forming a source/drain region in a transistor. In this embodiment, the surface S1 of the epitaxial layer 130 is higher than the top surface S2 of the substrate 110, so that improving the performances of the epitaxial layer 130 induces stresses on the gate channel C right below the gate structure G, but it is not limited thereto. In a preferred embodiment, each recess R has a diamond-shaped cross-sectional profile structure or other shaped cross-sectional profile structure. In other words, the sidewalls of each recess R below the gate structure G has a sharp corner, enabling the epitaxial layer 130 formed in each recess R to have a diamond shaped cross-sectional profile structure as well. Thus, the stresses induced by the epitaxial layer 130 on the gate channel C can be increased. In this embodiment, the epitaxial layer 130 may be a silicon germanium epitaxial layer, and the concentration of germanium is larger than 36% for forming a P-MOS transistor. In another embodiment, the epitaxial layer 130 may be a silicon carbide epitaxial layer for forming an N-MOS transistor. Or, the epitaxial layer 130 may be a silicon epitaxial layer, or an epitaxial layer with different material layers, so that the epitaxial layer 130 may be composed of a lower silicon germanium epitaxial layer and an upper silicon epitaxial layer. An epitaxial layer (not shown) with low concentration of germanium such as 25% of germanium or a pure silicon epitaxial layer may also be selectively formed in each recess R trough a selective epitaxial process to prevent the threshold voltage of the transistors from decreasing dramatically due to the great difference of lattice constant while contacting the surfaces between the epitaxial layer 130 and the substrate 110, but it is not limited thereto.

Figure 4:
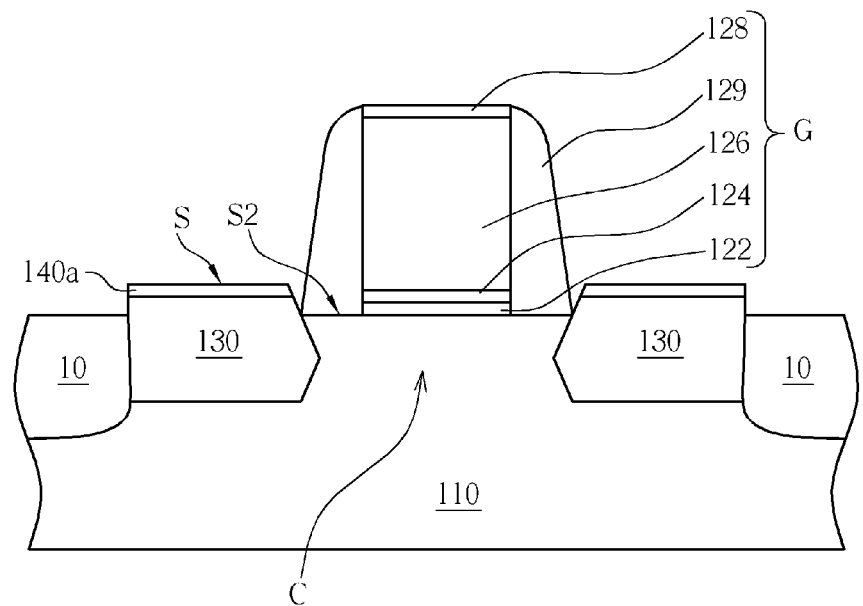

As shown in FIG. 4, an epitaxial process is performed to form a silicon epitaxial layer 140a with low germanium concentration on the epitaxial layer 130 to serve as a reacting region during a later salicide process, so that agglomeration of metals and germanium during the salicide process can be avoided. In this embodiment, the epitaxial layer 130 is a silicon germanium epitaxial layer, and germanium in the epitaxial layer 130 may diffuse to the surface S of the silicon epitaxial layer 140a, resulting in black spots generated on the surface S of the silicon epitaxial layer 140a.

A second embodiment solving the problem of the first embodiment is presented in the following. FIGS. 5-10 schematically depict cross-sectional views of a semiconductor process according to a second embodiment of the present invention.

Figure 6:
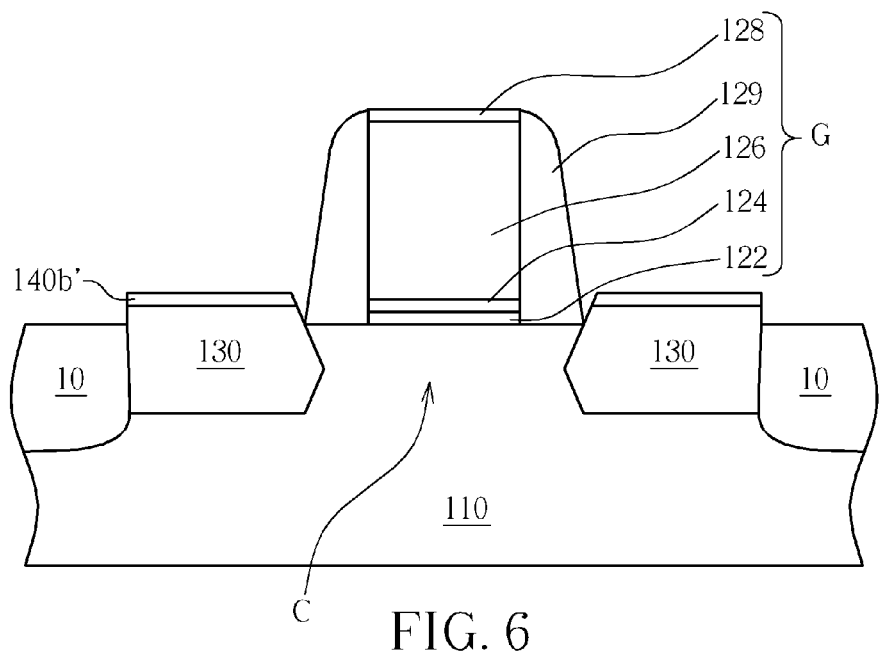
Figure 7:
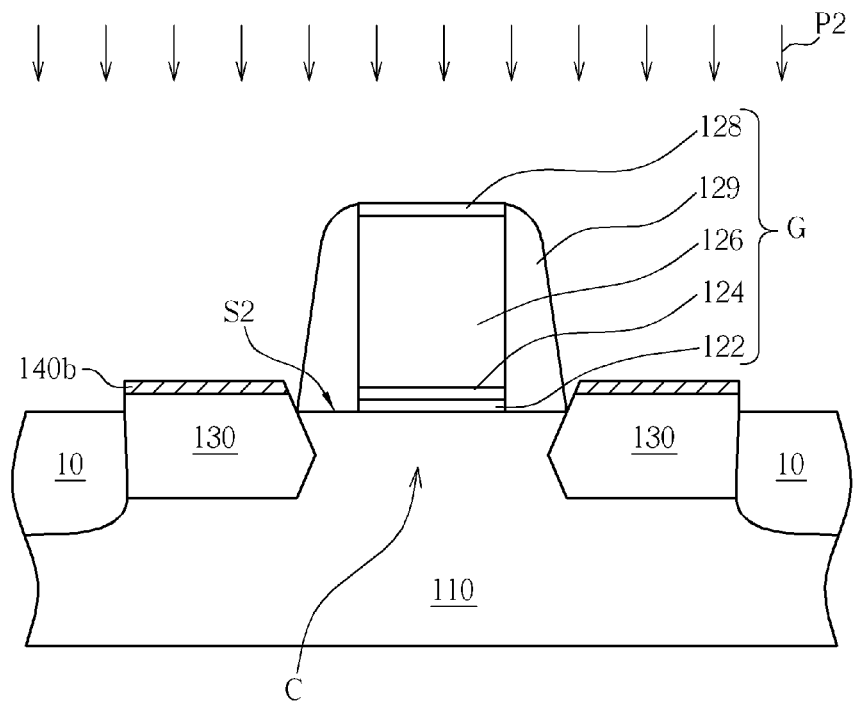

After the epitaxial layer 130 is formed (as shown in FIG. 3), a carbon-containing silicon germanium cap layer 140b is formed on the epitaxial layer 130. A first forming method is shown in FIG. 5, and a second forming method is shown in FIGS. 6-7.

Figure 5:
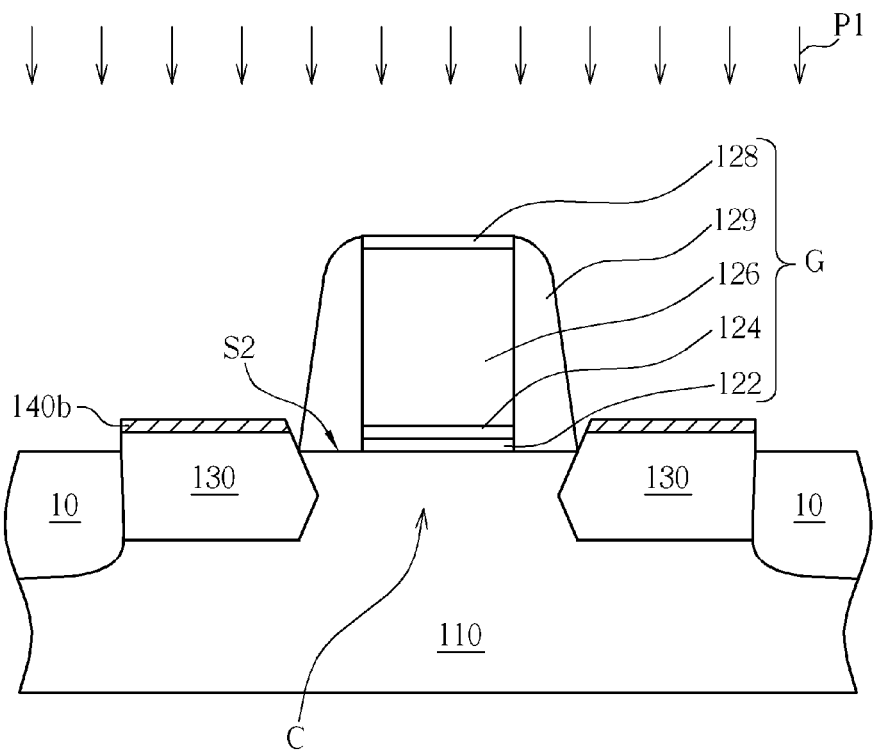
FIGS. 5-10 schematically depict cross-sectional views of a semiconductor process according to a second embodiment of the present invention.

The first method:

As shown in FIG. 5, an in-situ epitaxial process P1 is performed to form a carbon-containing silicon germanium cap layer 140b on the epitaxial layer 130. More precisely, the in-situ epitaxial process P1 is implanting carbon atoms in the cap layer while the silicon germanium cap is formed. The processing gas imported in the in-situ epitaxial process P1 may be methyl silane (MS) or monomethyl silane (MMS) etc, and the chemical formula may be $(CH_3)_xSi_{4-x}$; $X>1$, so that carbon can be implanted into the silicon germanium cap layer while the silicon germanium cap layer is formed, so that the carbon-containing silicon germanium cap layer 140b can be formed, but it is not limited thereto.

The second method:

As shown in FIG. 6, a silicon germanium cap layer 140b' is formed on the epitaxial layer 130. As shown in FIG. 7, a doping process P2 is performed to implant carbon atoms into the silicon germanium cap layer 140b'. Therefore, a carbon-containing silicon germanium cap layer 140b can be formed in the epitaxial layer 130. The processing gas imported while doping carbon may be methyl silane (MS) or monomethyl silane (MMS) etc, and the chemical formula may be $(CH_3)_x Si_{4-x}$; $X>1$. Otherwise, an ion implantation process may be performed to implant carbon, but it is not limited thereto.

The carbon-containing silicon germanium cap layer 140b can be formed by the epitaxial layer 130 by the first method or the second method. In this embodiment, the carbon-containing silicon germanium cap layer 140b is higher than the top surface S2 of the substrate 110. Due to the carbon-containing silicon germanium cap layer 140b containing carbon, diffusion of germanium in the epitaxial layer 130 and in the carbon-containing silicon germanium cap layer 140b upwards to the surface of the carbon-containing silicon germanium cap layer 140b during subsequent processes, such as a salicide process or etc, which leads to the formation of black spots on the surface of the carbon-containing silicon germanium cap layer 140b and degrades the performances of transistors, can be avoided. However, as the carbon content of the carbon-containing silicon germanium cap layer 140b is too high, tensile stresses on the gate channel C induced by the silicon germanium cap layer 140b will cancel out the compressive stresses induced by the epitaxial layer 130 on the channel C. The effect of the epitaxial layer 130 inducing forces on the channel C is therefore reduced. In a preferred embodiment, the chemical formula of the carbon-containing silicon germanium cap layer 140b is $SiGe_xC_z$ and the carbon concentration of the carbon-containing silicon germanium cap layer 140b is 0.1%~1%, while the X value is larger than or equal to 0%. The distribution of the carbon content of the carbon-containing silicon germanium cap layer 140b is a gradient from top to bottom. So, the diffusion of germanium in the epitaxial layer 130 or in the carbon-containing silicon germanium cap layer 140b can be avoided and the tensile stresses induced by the carbon-containing silicon germanium cap layer 140b on the gate channel C can be reduced by adjusting the distribution of the carbon content of the carbon-containing silicon germanium cap layer 140b. In one case, the distribution of the carbon content of the carbon-containing silicon germanium cap layer 140b is a gradient decreasing vertically from top to bottom. In another way, the distribution of the carbon content of the carbon-containing silicon germanium cap layer 140b may be a gradient decreasing horizontally from away to close to the gate structure G, but it is not limited thereto. Furthermore, the distribution of the germanium content of the carbon-containing silicon germanium cap layer 140b may be formed as a gradient decreasing from bottom to top, in order to preventing germanium in the carbon-containing silicon germanium cap layer 140b from diffusing to the surface of the carbon-containing silicon germanium cap layer 140b. Due to the upwards diffusion of germanium in the epitaxial layer 130, the distribution of germanium in the epitaxial layer 130 may be a gradient decreasing from bottom to top.

Figure 8:
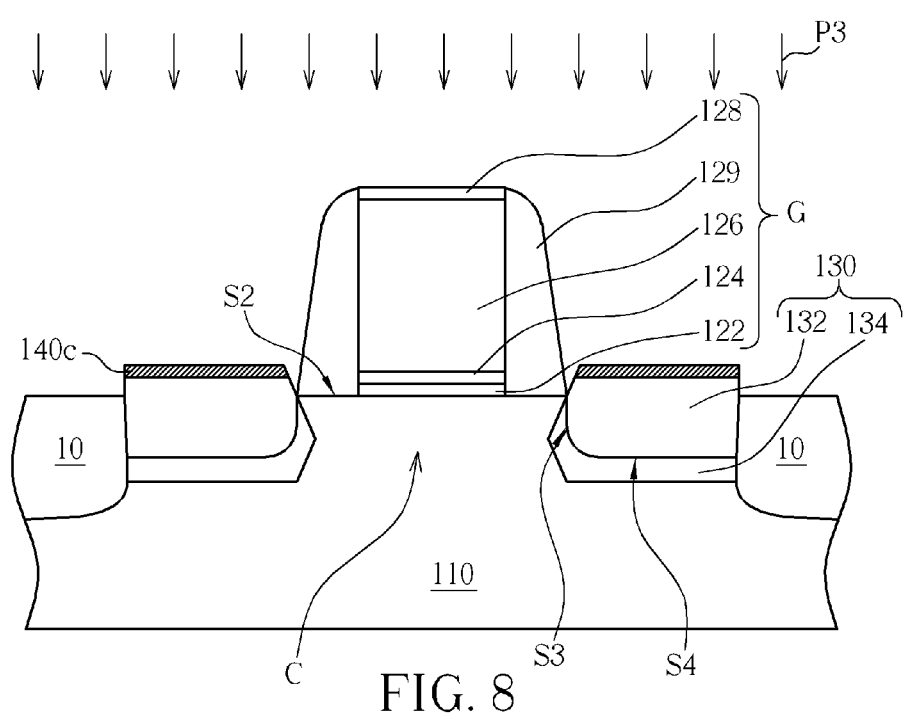

As shown in FIG. 8, after the carbon-containing silicon germanium cap layer 140b is formed, a doping process P3 may be selectively performed to implant boron atoms into the carbon-containing silicon germanium cap layer 140b, so that a carbon and boron-containing silicon germanium cap layer 140c can be formed. The carbon and boron-containing silicon germanium cap layer 140c will be consumed partially or entirely as a metal silicide covers the carbon and boron-containing silicon germanium cap layer 140c. Since the carbon and boron-containing silicon germanium cap layer 140c remains, the carbon and boron-containing silicon germanium cap layer 140c can reduce the contact resistance. In this embodiment, boron is implanted into the carbon-containing silicon germanium cap layer 140b and the epitaxial layer 130 at the same time while the doping process P3 is performed. In this embodiment, the epitaxial layer 130 is a silicon germanium epitaxial layer and boron is implanted into the inside of the epitaxial layer 130. A photoresist may be used as a mask (not shown) selectively, enabling boron being implanted only in the inside of the epitaxial layer 130, so that an internal epitaxial layer area 132 and an external epitaxial layer area 134 undoped with boron are formed, wherein the external epitaxial layer area 134 coats the sidewall S3 and the bottom surface S4 of the internal epitaxial layer area 132. In another embodiment, boron may just be implanted into the carbon-containing silicon germanium cap layer 140b.

In another way, after the silicon germanium cap layer 140b' is formed on the epitaxial layer 130 by the second method (as shown in FIG. 6), boron may be implanted into the silicon germanium cap layer 140b' by the doping process P3 to form a boron containing silicon germanium cap layer (not shown). Then, carbon is implanted into the boron containing silicon germanium cap layer (not shown) by the doping process P2 to form a carbon and boron-containing silicon germanium cap layer 140c on the epitaxial layer 130. Furthermore, boron may be implanted into the epitaxial layer 130 as well while boron is implanted into the silicon germanium cap layer 140b'.

Figure 9:
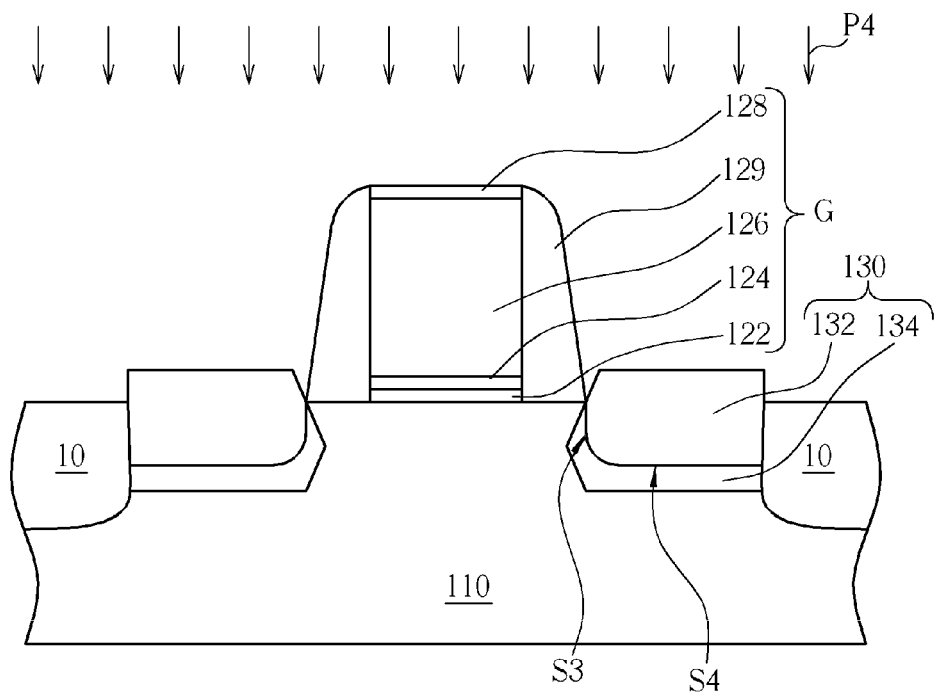
Figure 10:
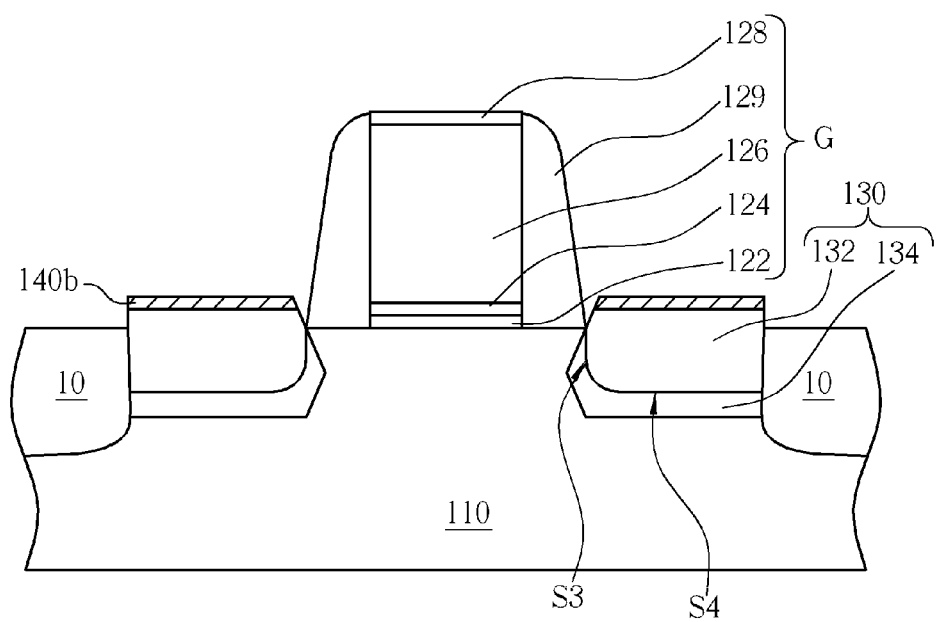

In another way, boron may be implanted into the cap layer or the epitaxial layer before the cap layer is formed, or after the cap layer is formed. As shown in FIG. 9, after the epitaxial layer 130 is formed (as shown in FIG. 3), a doping process P4 may be performed to implant boron into the epitaxial layer 130. As shown in FIG. 9, a photoresist may be used as a selective mask (not shown), enabling boron being implanted into the inside of the epitaxial layer 130, so that an internal epitaxial layer area 132 and an external epitaxial layer area 134 without boron doping are formed, wherein the external epitaxial layer area 134 coats the sidewalls S3 and the bottom surface S4 of the internal epitaxial layer area 132. As shown in FIG. 10, the carbon-containing silicon germanium cap layer 140b is formed on the epitaxial layer 130 by said first method or said second method. The carbon-containing silicon germanium cap layer 140b does not have boron at this time, so that boron may be further implanted into the carbon-containing silicon germanium cap layer 140b. Due to the epitaxial layer 130 already containing boron, boron atoms already present inside may diffuse to the carbon-containing silicon germanium cap layer 140b during following thermal processes. Or, boron may be just implanted into the carbon-containing silicon germanium cap layer 140b as the carbon-containing silicon germanium cap layer 140b is formed on the epitaxial layer 130, so that a carbon and boron-containing silicon germanium cap layer 140c can be formed.

After the carbon-containing silicon germanium cap layer 140b or the carbon and boron-containing silicon germanium cap layer 140c are formed on the epitaxial layer 130 by applying the first method or the second method, a silicon-containing cap layer (not shown) may further be formed on the carbon-containing silicon germanium cap layer 140b or on the carbon and boron-containing silicon germanium cap layer 140c, to provide a layer that would be consumed during a later salicide process, thereby structures under the silicon-containing cap layer (not shown) can be reserved.

In summary, the present invention provides a semiconductor structure and a process thereof that forms a carbon-containing silicon germanium cap layer on an epitaxial layer, to prevent germanium in the epitaxial layer or in the cap layer from precipitating to the surface of the cap layer. Therefore, the formation of black spots on the surface of the cap layer is avoided. Specifically, methods of forming the carbon-containing silicon germanium cap layer on the epitaxial layer may include: (1) a carbon-containing silicon germanium cap layer is formed on the epitaxial layer by an in-situ epitaxial process; or, (2) a silicon germanium cap layer is formed on the epitaxial layer, and then carbon is implanted into the silicon germanium cap layer by a doping process, so that a carbon-containing silicon germanium cap layer is formed on the epitaxial layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a gate structure located on a substrate;
an epitaxial layer located in the substrate beside the gate structure; and
a carbon-containing silicon germanium cap layer located on the epitaxial layer, wherein the carbon-containing silicon germanium cap layer is higher than a top surface of the substrate, and the distribution of the carbon content of the carbon-containing silicon germanium cap layer has a gradient decreasing from top to bottom.

2. The semiconductor structure according to claim 1, wherein the carbon-containing silicon germanium cap layer comprises a carbon and boron-containing silicon germanium cap layer.

3. The semiconductor structure according to claim 1, wherein the chemical formula of the carbon-containing silicon germanium cap layer is $SiGe_xC_z$, and the carbon concentration of the carbon-containing silicon germanium cap layer is 0.1%~1%.

4. The semiconductor structure according to claim 1, wherein the distribution of the germanium content of the carbon-containing silicon germanium cap layer has a gradient decreasing from bottom to top.

5. The semiconductor structure according to claim 1, wherein the carbon-containing silicon germanium cap layer is higher than a bottom surface of the substrate.

6. The semiconductor structure according to claim 1, further comprising a silicon-containing cap layer located on the carbon-containing silicon germanium cap layer.

7. The semiconductor structure according to claim 1, wherein the epitaxial layer comprises a silicon germanium epitaxial layer.

8. The semiconductor structure according to claim 1, wherein the epitaxial layer comprises a silicon germanium epitaxial layer coating sidewalls and a bottom surface of a boron containing silicon germanium epitaxial layer.

9. The semiconductor structure according to claim 1, wherein the surface of the carbon-containing silicon germanium cap layer is higher than the surface of the substrate.

10. A semiconductor structure, comprising:
   a gate structure located on a substrate;
   an epitaxial layer located in the substrate beside the gate structure; and
   a carbon-containing silicon germanium cap layer located on the epitaxial layer, wherein the carbon-containing silicon germanium cap layer is higher than the top surface of the substrate, and the distribution of the germanium content of the carbon-containing silicon germanium cap layer has a gradient decreasing from bottom to top.

11. A semiconductor structure, comprising:
   a gate structure located on a substrate;
   an epitaxial layer located in the substrate beside the gate structure, wherein the epitaxial layer comprises a silicon germanium epitaxial layer coating sidewalls and a bottom surface of a boron containing silicon germanium epitaxial layer; and
   a carbon-containing silicon germanium cap layer located on the epitaxial layer, wherein the carbon-containing silicon germanium cap layer is higher than the top surface of the substrate.

* * * * *